(12) United States Patent
Kim et al.

(10) Patent No.: US 11,456,192 B2
(45) Date of Patent: Sep. 27, 2022

(54) APPARATUS AND METHOD FOR COOLING SUBSTRATE

(71) Applicant: SEMIgear, Inc., Wakefield, MA (US)

(72) Inventors: Jonghoon Kim, Pyeongtaek-si (KR); Jihoon Kim, Pyeongtaek-si (KR)

(73) Assignee: SEMIgear, Inc., Wakefield, MA (US)

( * ) Notice: Subject to any disclaimer, the term of this patent is extended or adjusted under 35 U.S.C. 154(b) by 316 days.

(21) Appl. No.: 16/823,338

(22) Filed: Mar. 19, 2020

(65) Prior Publication Data

US 2021/0035828 A1 Feb. 4, 2021

(30) Foreign Application Priority Data

Aug. 2, 2019 (KR) .................. 10-2019-0094494

(51) Int. Cl.
*H01L 21/67* (2006.01)
*H01L 21/683* (2006.01)
*H05K 7/20* (2006.01)
*F28F 13/00* (2006.01)

(52) U.S. Cl.
CPC .. *H01L 21/67103* (2013.01); *H01L 21/67248* (2013.01); *H01L 21/6831* (2013.01); *H01L 21/6833* (2013.01); *H05K 7/2039* (2013.01); *F28F 2013/008* (2013.01); *H01L 2224/76501* (2013.01)

(58) Field of Classification Search
CPC ......... H01L 21/67103; H01L 21/67248; H01L 21/6831; H01L 21/6833; H01L 2224/76501; H01L 24/742; H01L 2224/11849; H01L 2224/742; H01L 2224/94; H01L 21/6719; H01L 21/67109; H01L 21/68742; H01L 21/67098; H01L 21/67259; H01L 21/683; H05K 7/2039; F28F 2013/008
See application file for complete search history.

(56) References Cited

U.S. PATENT DOCUMENTS

| | | | |
|---|---|---|---|
| 2006/0113290 A1* | 6/2006 | Shareef | B23K 26/703 219/121.65 |
| 2006/0120011 A1* | 6/2006 | Handa | H01L 21/67109 361/234 |
| 2015/0258582 A1* | 9/2015 | Hashizume | B05C 11/08 156/345.23 |
| 2019/0355597 A1* | 11/2019 | Mochizuki | H01L 29/66795 |
| 2020/0194243 A1* | 6/2020 | Gunther | H01J 37/32724 |
| 2020/0312684 A1* | 10/2020 | Mine | H01L 21/6831 |
| 2020/0395198 A1* | 12/2020 | Allen | H01J 37/3244 |
| 2021/0005477 A1* | 1/2021 | Son | C23C 16/4411 |
| 2021/0134627 A1* | 5/2021 | Peng | H01L 22/30 |

FOREIGN PATENT DOCUMENTS

| | | |
|---|---|---|
| JP | 2014-236145 A | 12/2014 |
| KR | 10-2015-0122887 A | 11/2015 |
| KR | 10-2016-0017391 A | 2/2016 |
| KR | 10-2018-0113221 A | 10/2018 |

* cited by examiner

*Primary Examiner* — Mamadou L Diallo
(74) *Attorney, Agent, or Firm* — Park, Kim & Suh, LLC

(57) ABSTRACT

The inventive concept relates to a substrate cooling apparatus for cooling a substrate. The substrate cooling apparatus includes a chuck on which the substrate is placed and a cooling unit that cools the chuck. The cooling unit includes a heat dissipation plate that has the chuck placed on an upper surface thereof and that dissipates heat of the chuck.

10 Claims, 11 Drawing Sheets

APPARATUS AND METHOD FOR COOLING SUBSTRATE

CROSS-REFERENCE TO RELATED APPLICATIONS

A claim for priority under 35 U.S.C. § 119 is made to Korean Patent Application No. 10-2019-0094494 filed on Aug. 2, 2019, in the Korean Intellectual Property Office, the entire contents of which are hereby incorporated by reference.

BACKGROUND

Embodiments of the inventive concept described herein relate to a substrate cooling apparatus and method for cooling a substrate.

In general, a semiconductor integrated circuit is a very small and thin silicon chip, but includes various electronic components, and various manufacturing processes including a photolithography process, an etching process, a deposition process, and the like are performed to manufacture one semiconductor chip.

A reflow process is one of back-end-of-line (BEOL) processes for semiconductor integrated circuit (IC) fabrication. The reflow process is a process of forming, on a wafer, small bumps having a small volume and capable of transferring signals at high speed, instead of metal wires that serve to transfer electrical signals. Multiple processes have to be performed to form the bumps. In one of the processes, the wafer is cooled. For a stepwise temperature drop of the wafer, the temperature of the wafer and the temperature of a chuck on which a wafer is mounted in the preceding process are lowered to a predetermined range.

Accordingly, the temperature of the chuck, which greatly affects an environment in which the bumps are formed on the wafer, has to be prevented from being excessively raised by the heat of the wafer. Furthermore, a temperature difference between regions of the wafer during cooling may cause warpage of the wafer or damage to the wafer.

SUMMARY

Embodiments of the inventive concept provide a substrate cooling apparatus and method for preventing the temperature of a chuck from being excessively raised by heat of a substrate.

Embodiments of the inventive concept provide a substrate cooling apparatus and method for uniformly cooling a substrate.

Embodiments of the inventive concept provide a substrate cooling apparatus and method for improving cooling efficiency.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for cooling a substrate includes a chuck on which the substrate is placed and a cooling unit that cools the chuck. The cooling unit includes a heat dissipation plate that has the chuck placed on an upper surface thereof and that dissipates heat of the chuck.

The heat dissipation plate may have, on the upper surface thereof, grooves concavely formed downward.

The grooves may be radially formed when viewed from above.

The cooling unit may further include an inner cover that has the heat dissipation plate supported on an upper surface of a bottom wall thereof and that moves in a vertical direction and a cooling member that is provided under the bottom wall of the inner cover and that cools the inner cover.

The cooling unit may further include an outer cover having a space formed therein in which the inner cover is received, and the cooling member may be provided on a bottom wall of the outer cover.

The bottom wall of the outer cover may include a first region and a second region that is a different region from the first region. The cooling unit may further include an elastic unit that supports the first region and applies elastic force to the first region in the vertical direction to locate the first region in a higher position than the second region in a state in which the bottom wall of the inner cover is spaced apart from the bottom wall of the outer cover, a temperature measurement unit that measures temperatures of respective regions of the chuck, and a controller that controls the elastic unit to adjust a height of the first region in the state in which the bottom wall of the inner cover is spaced apart from the bottom wall of the outer cover, based on temperature of a region of the chuck corresponding to the first region and temperature of a region of the chuck corresponding to the second region that are measured by the temperature measurement unit.

The elastic unit may include an air spring that supports the first region and an air regulation member that supplies air into the air spring and releases the air from the air spring. The controller may control the air regulation member to regulate an amount of air received in the air spring and thus control the height of the first region.

According to an exemplary embodiment, a method for cooling a substrate using the apparatus includes a substrate mounting step of mounting the substrate on the chuck in a state in which the inner cover is raised so as to be spaced apart from the bottom wall of the outer cover, a first temperature measurement step of measuring temperatures of respective regions of the chuck, a height adjustment step of adjusting the height of the first region, based on temperature of a region of the chuck corresponding to the first region and temperature of a region of the chuck corresponding to the second region that are measured in the temperature measurement step, a lowering step of lowering the inner cover until the bottom wall of the inner cover is brought into contact with the first region and the second region, a second temperature measurement step of measuring temperatures of respective regions of the chuck in a state in which the bottom wall of the inner cover is brought into contact with the first region and the second region, and a raising step of raising the inner cover when temperature of the region of the chuck corresponding to the first region and temperature of the region of the chuck corresponding to the second region that are measured in the second temperature measurement step are lowered to a predetermined temperature.

The elastic unit may include an air spring that supports the first region and an air regulation member that supplies air into the air spring and releases the air from the air spring. In the height adjustment step, the height of the first region may be adjusted by regulating an amount of air received in the air spring by using the air regulation member.

In the height adjustment step, the first region may be raised to a higher position with an increase in a temperature difference between the region of the chuck corresponding to the first region and the region of the chuck corresponding to the second region.

The method may further include a height maintaining step between the second temperature measurement step and the raising step. In the height maintaining step, the elastic unit may be controlled to locate the first region at the same height as the second region in a state in which the bottom wall of the inner cover is spaced apart from the bottom wall of the outer cover.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
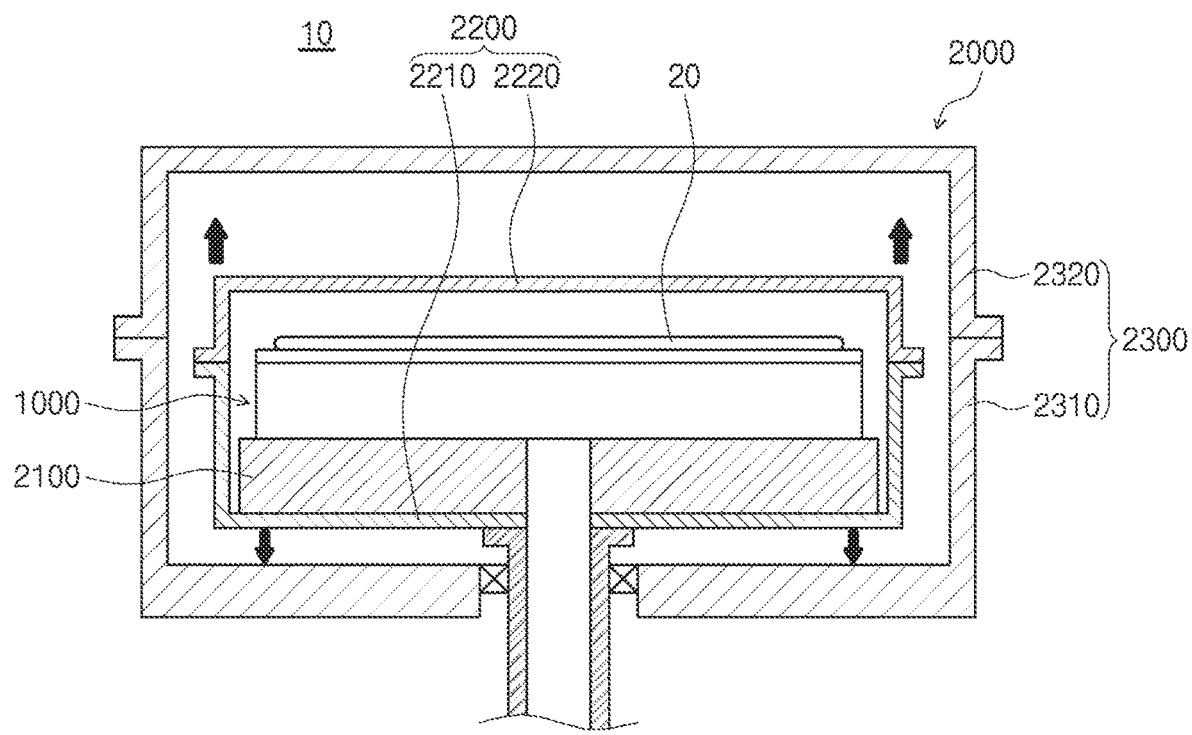
FIG. 1 is a sectional view illustrating a substrate cooling apparatus according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Substrate cooling apparatuses according to embodiments of the inventive concept may be apparatuses for cooling a wafer heated in the preceding process to a predetermined temperature in a reflow process that is one of back-end-of-line (BEOL) processes for semiconductor integrated circuit (IC) fabrication.

FIG. 1 is a sectional view illustrating a substrate cooling apparatus 10 according to an embodiment of the inventive concept. Referring to FIG. 1, the substrate cooling apparatus 10 cools a substrate 20. For example, the substrate 20 may be a semiconductor wafer. The substrate cooling apparatus 10 includes a chuck 1000 and a cooling unit 2000.

The substrate 20 is placed on an upper surface of the chuck 1000. The cooling unit 2000 cools the chuck 1000. According to an embodiment, the cooling unit 2000 includes a heat dissipation plate 2100, an inner cover 2200, and an outer cover 2300.

Figure 2:
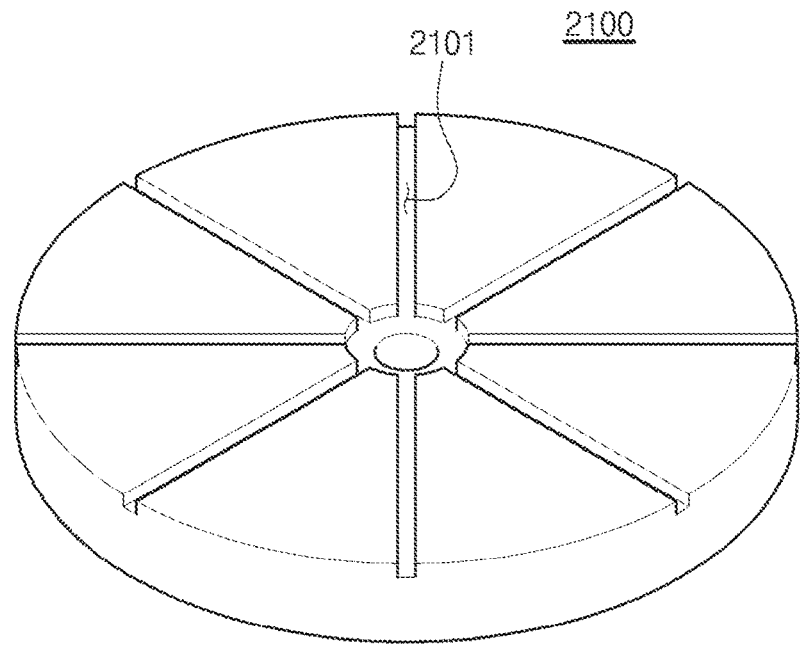
FIG. 2 is a perspective view illustrating a heat dissipation plate of FIG. 1.

FIG. 2 is a perspective view illustrating the heat dissipation plate 2100 of FIG. 1. Referring to FIGS. 1 and 2, the chuck 1000 is placed on an upper surface of the heat dissipation plate 2100. The heat dissipation plate 2100 is formed of a material having a high thermal conductivity. For example, the heat dissipation plate 2100 may be formed of an aluminum (Al) material. Heat of the substrate 20 is transferred to the chuck 1000, and heat of the chuck 1000 is dissipated through the heat dissipation plate 2100 in the state in which a lower surface of the chuck 1000 is brought into contact with the upper surface of the heat dissipation plate 2100.

The heat dissipation plate 2100 may have grooves 2101 formed on the upper surface thereof. The grooves 2101 are concavely formed downward from the upper surface of the heat dissipation plate 2100. The heat of the chuck 1000 may be more effectively distributed through the grooves 2101. According to an embodiment, the grooves 2101 may be radially formed when viewed from above. Alternatively, because the temperature distributions of the chucks 1000 may differ from one another depending on the individual substrate cooling apparatuses 10, the grooves 2101 may be provided in different forms depending on the temperature distributions of the chucks 1000 of the substrate cooling apparatuses 10 that are measured before cooling in the state in which the substrate 20 heated through a test operation is mounted on the chucks 1000.

Referring again to FIG. 1, the inner cover 2200 has a space therein in which the heat dissipation plate 2100 is received. According to an embodiment, the heat dissipation plate 2100 is supported on an upper surface of the bottom of the inner cover 2200. The inner cover 2200 is vertically moved by an actuator (not illustrated). According to an embodiment, the inner cover 200 includes a lower inner cover 2210 and an upper inner cover 2220 that are combined together to form the space in which the heat dissipation plate 2100 is received. The heat dissipation plate 2100 is mounted on the bottom of the lower inner cover 2210. The upper inner cover 2220 may be provided so as to be opened or closed. When the substrate 20 is cooled, the interior space of the inner cover 2200 is sealed by allowing the upper inner cover 2220 to cover the top of the lower inner cover 2210.

The outer cover 2300 has a space therein in which the inner cover 2200 is received. According to an embodiment, the outer cover 2300 includes a lower outer cover 2310 and an upper outer cover 2320 that are combined together to form the space in which the inner cover 2200 is received. The upper outer cover 2320 covers the top of the lower outer cover 2310 and is provided so as to be opened or closed. When the substrate 20 is cooled, the interior space of the outer cover 2300 is sealed by allowing the upper outer cover 2320 to cover the top of the lower outer cover 2310.

According to this embodiment, the substrate 20 is cooled for a predetermined period of time in the sealed inner cover 2200, which is provided in the sealed outer cover 2300, in the state of being mounted on the chuck 1000.

Figure 3:
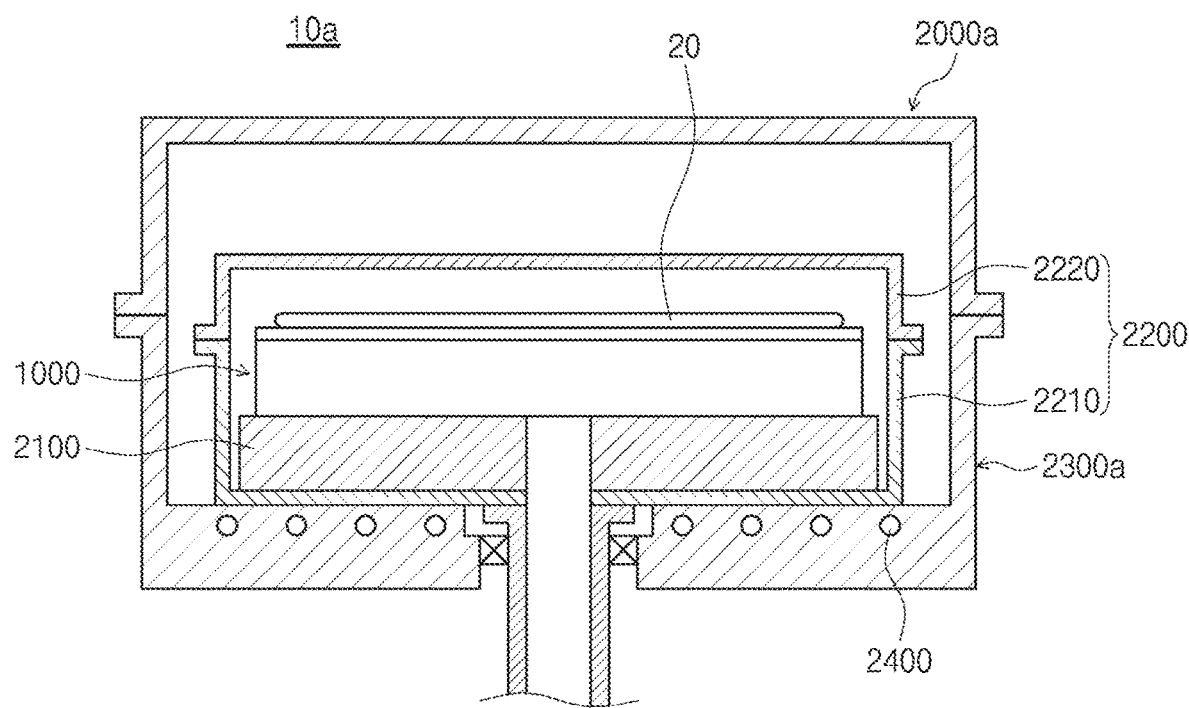
FIG. 3 is a sectional view illustrating a substrate cooling apparatus according to another embodiment of the inventive concept.

FIG. 3 is a sectional view illustrating a substrate cooling apparatus 10*a* according to another embodiment of the inventive concept. Referring to FIG. 3, unlike the cooling unit 2000 of the substrate cooling apparatus 10 of FIG. 1, a cooling unit 2000*a* of the substrate cooling apparatus 10*a* further includes a cooling member 2400. The cooling member 2400 cools the inner cover 2200. According to an embodiment, the cooling member 2400 is provided under the bottom wall of the inner cover 2200. For example, the cooling member 2400 is provided in the bottom wall of an outer cover 2300*a*. The cooling member 2400 may be implemented with a cooling fluid channel that is formed in the bottom wall of the outer cover 2300*a* and through which a cooling fluid, such as cooling water, flows. Alternatively, the cooling member 2400 may be provided in various configurations capable of generating cold air.

According to this embodiment, in the state of being mounted on the chuck 1000, the substrate 20 is cooled for a predetermined period of time in the sealed inner cover 2200 in contact with the bottom of the sealed outer cover 2300*a* into which the cooling member 2400 generating cold air is inserted. The substrate cooling apparatus 10*a* according to this embodiment includes the cooling member 2400, thereby further increasing cooling efficiency.

The other components, structures, and functions of the substrate cooling apparatus 10*a* are the same as, or similar to, those of the substrate cooling apparatus 10 of FIG. 1, except that the substrate cooling apparatus 10*a* includes the cooling member 2400.

Figure 4:
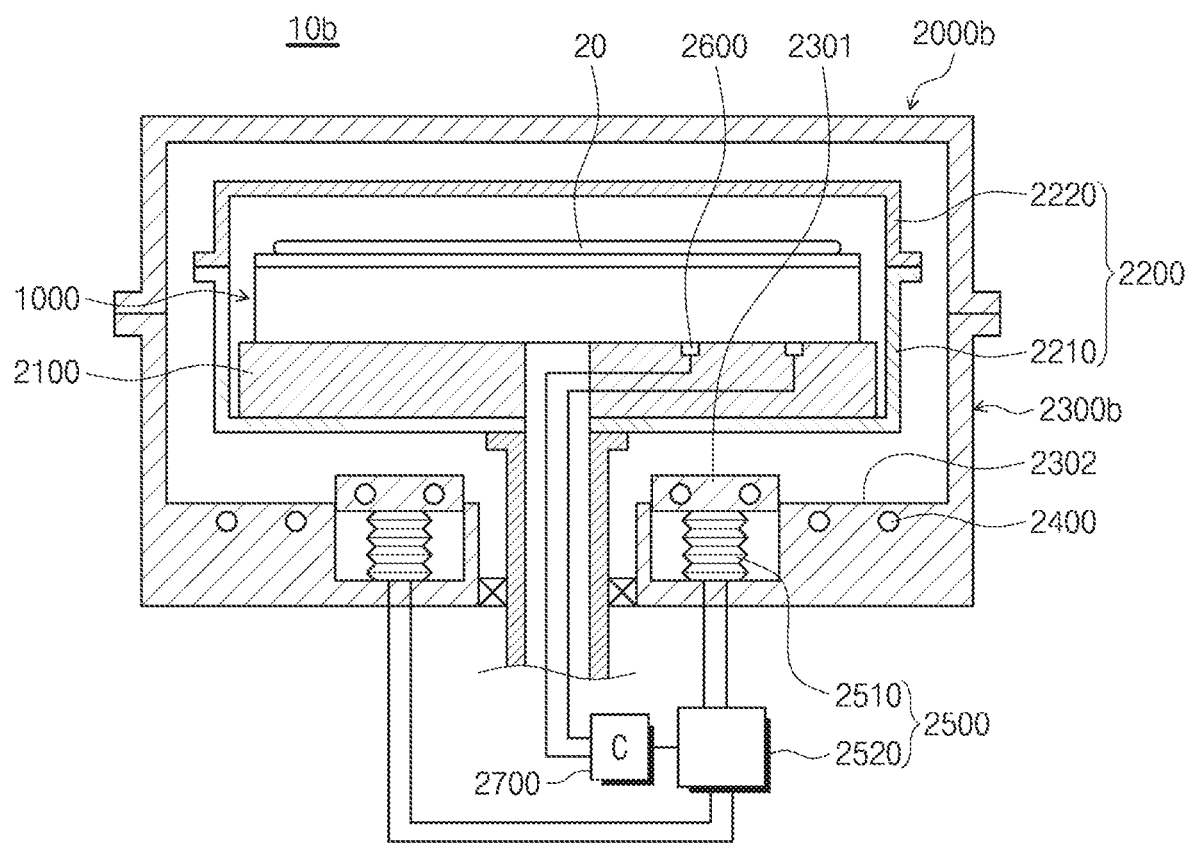
FIG. 4 is a sectional view illustrating a substrate cooling apparatus according to another embodiment of the inventive concept.
Figure 5:
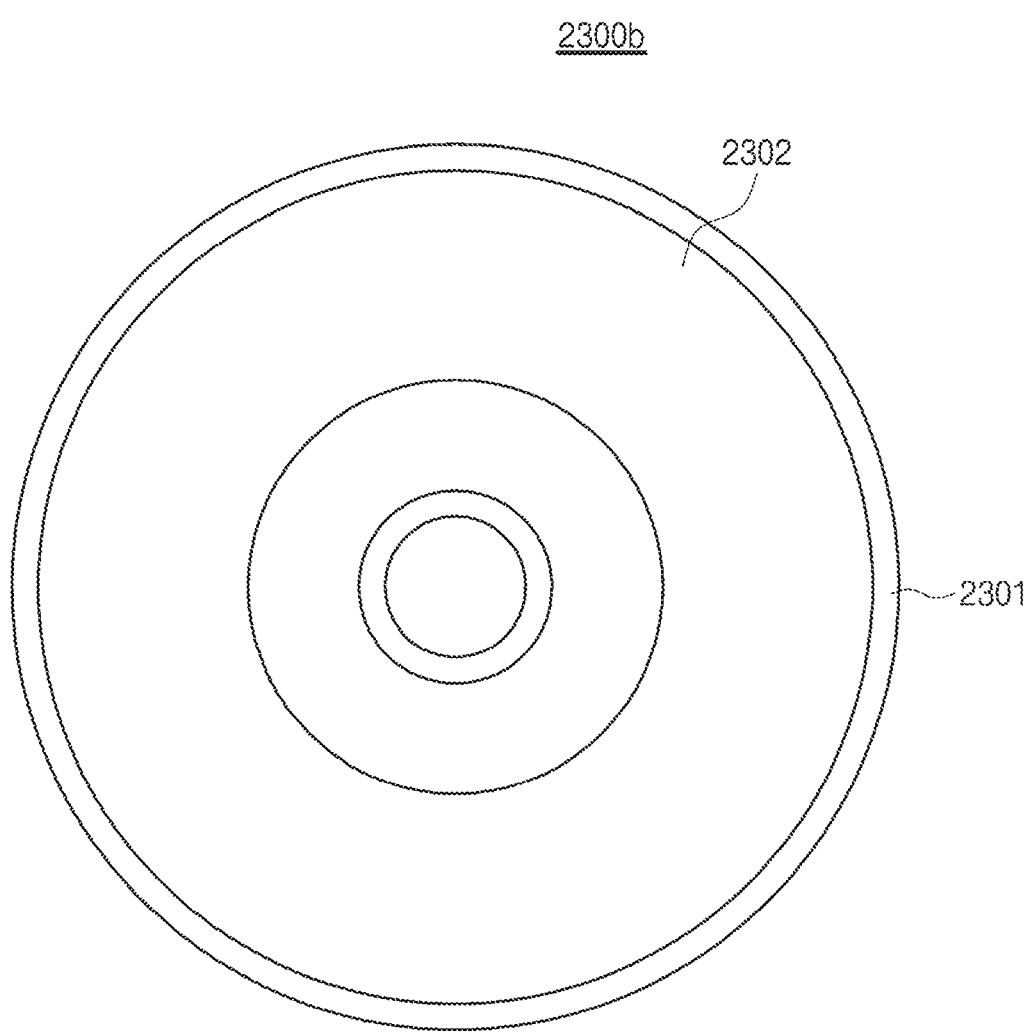
FIG. 5 is a plan view illustrating an outer cover of FIG. 4.
Figure 6:
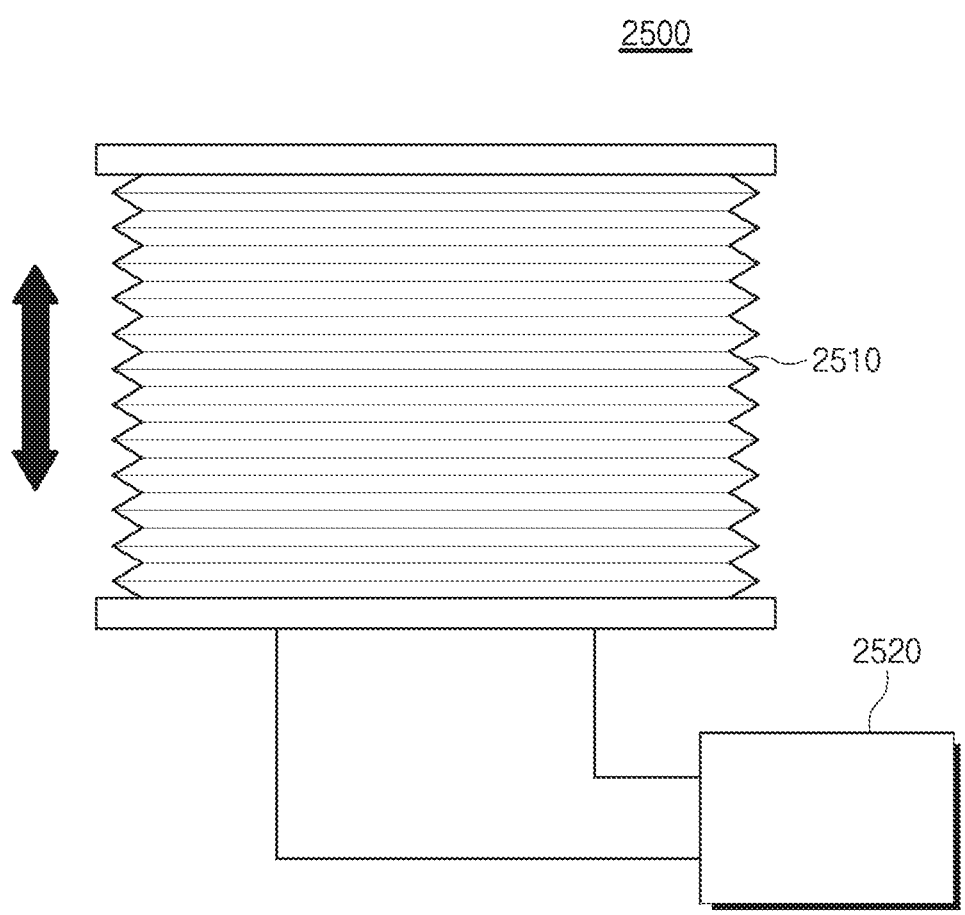
FIG. 6 is a schematic view illustrating an elastic unit of FIG. 4.

FIG. 4 is a sectional view illustrating a substrate cooling apparatus 10*b* according to another embodiment of the inventive concept. FIG. 5 is a plan view illustrating an outer cover 2300*b* of FIG. 4. FIG. 6 is a schematic view illustrating an elastic unit 2500 of FIG. 4. Referring to FIGS. 4 to 6, unlike the bottom wall of the outer cover 2300*a* of the substrate cooling apparatus 10*a* of FIG. 3, the bottom wall of the outer cover 2300*b* of the substrate cooling apparatus 10*b* includes a first region 2301 and a second region 2302. The first region 2301 and the second region 2302 of the bottom wall of the outer cover 2300*b* are different regions. According to an embodiment, the first region 2301 may be the central region of the bottom wall of the outer cover 2300*b*, and the second region 2302 may be the edge region of the bottom wall of the outer cover 2300*b*. Alternatively, the first region 2301 and the second region 2302 may be provided in different forms and arrangements depending on the temperature distributions of the chucks 1000 of the substrate cooling apparatuses 10*b* that are measured before cooling in the state in which the substrate 20 heated through a test operation is mounted on the chucks 1000. In this specification, it is assumed that the temperature of a region of the chuck 1000 corresponding to the first region 2301 is higher than the temperature of a region of the chuck 1000 corresponding to the second region 2302 before cooling in the state in which the heated substrate 20 is mounted on the chuck 1000. The first region 2301 is provided so as to be movable in the vertical direction.

Unlike the cooling unit 2000*a* of the substrate cooling apparatus 10*a* of FIG. 3, a cooling unit 2000*b* of the substrate cooling apparatus 10*b* further includes the elastic unit 2500, a temperature measurement unit 2600, and a controller 2700.

The elastic unit 2500 supports the first region 2301 such that the first region 2301 is located in a higher position than the second region 2302 in the state in which the bottom wall of the inner cover 2200 is spaced apart from the bottom wall of the outer cover 2300*b*. The elastic unit 2500 applies elastic force to the first region 2301 in the vertical direction. According to an embodiment, the elastic unit 2500 includes an air spring 2510 and an air regulation member 2520.

The air spring 2510 is located under the first region 2301 and supports the first region 2301. A plurality of air springs 2510 may be arranged to be spaced apart from each other depending on the shape of the first region 2301. According to an embodiment, when the first region 2301 has a ring shape, the plurality of air springs 2510 may also be arranged in a ring shape depending on the shape of the first region 2301.

The air regulation member 2520 supplies air into the air spring 2510 or releases the air from the air spring 2510. The height of the top of the air spring 2510 is adjusted by the supply or release of the air by the air regulation member 2520.

The temperature measurement unit 2600 measures the temperatures of respective regions of the chuck 1000. According to an embodiment, the temperature measurement unit 2600 measures the temperatures of respective regions on the upper surface of the chuck 1000. Alternatively, the temperature measurement unit 2600 may selectively measure the temperature of the lower surface of the chuck 1000 as needed. The temperature measurement unit 2600 transfers the measured temperatures of the respective regions of the chuck 1000 to the controller 2700. According to an embodiment, the temperature measurement unit 2600 measures the temperature of the region of the chuck 1000 corresponding to the first region 2301 and the temperature of the region of the chuck 1000 corresponding to the second region 2302 and transfers the measured temperatures to the controller 2700.

The controller 2700 controls the elastic unit 2500 to adjust the height of the first region 2301 in the state in which the bottom wall of the inner cover 2200 is spaced apart from the bottom wall of the outer cover 2300*b*, based on the temperature of the region of the chuck 1000 corresponding to the first region 2301 and the temperature of the region of the chuck 1000 corresponding to the second region 2302 that are measured by the temperature measurement unit 2600. According to an embodiment, the controller 2700 controls the air regulation member 2520 to regulate the amount of air received in the air spring 2510, thereby controlling the height of the first region 2301.

The other components, structures, and functions of the substrate cooling apparatus 10*b* are the same as, or similar to, those of the substrate cooling apparatus 10*a* of FIG. 3.

Figure 7:
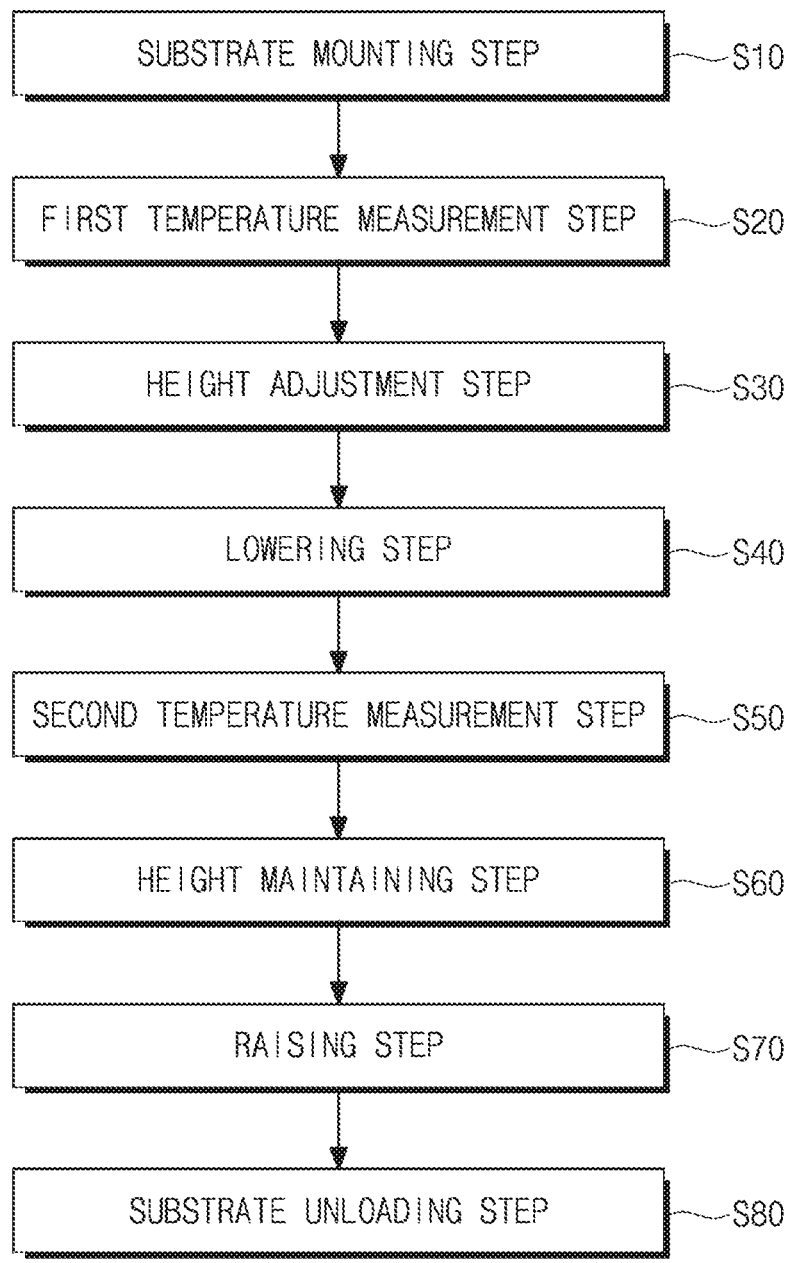
FIG. 7 is a flowchart illustrating a substrate cooling method according to an embodiment of the inventive concept.

Hereinafter, a substrate cooling method of cooling a substrate using the substrate cooling apparatus 10*b* of FIG. 4 will be described. FIG. 7 is a flowchart illustrating a substrate cooling method according to an embodiment of the inventive concept. Referring to FIGS. 4 and 7, the substrate cooling method includes substrate mounting step S10, first temperature measurement step S20, height adjustment step S30, lowering step S40, second temperature measurement step S50, height maintaining step S60, raising step S70, and substrate unloading step S80. Substrate mounting step S10, first temperature measurement step S20, height adjustment step S30, lowering step S40, second temperature measurement step S50, height maintaining step S60, raising step S70, and substrate unloading step S80 are sequentially performed.

In substrate mounting step S10, the substrate 20 is mounted on the chuck 1000 in the state in which the inner cover 2200 is raised so as to be spaced apart from the bottom wall of the outer cover 2300b. The substrate 20 mounted on the chuck 1000 in substrate mounting step S10 may be a semiconductor wafer heated in the preceding process.

In first temperature measurement step S20, the temperature measurement unit 2600 measures the temperatures of respective regions of the chuck 1000. The temperature measurement unit 2600 measures the temperature of the region of the chuck 1000 corresponding to the first region 2301 and the temperature of the region of the chuck 1000 corresponding to the second region 2302 and transfers the measured temperatures to the controller 2700.

Figure 8:
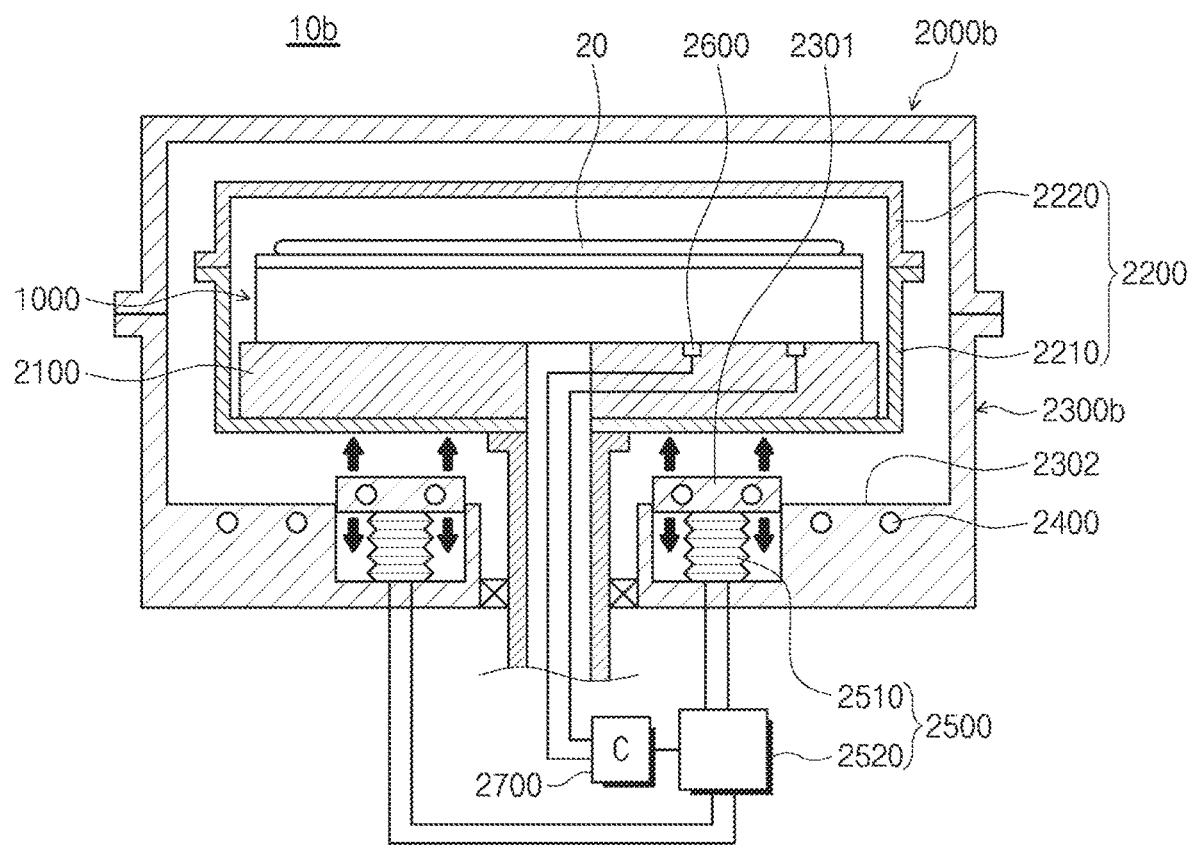
FIG. 8 is a side sectional view illustrating a state of the substrate cooling apparatus in a height adjustment step of FIG. 7.

FIG. 8 is a side sectional view illustrating a state of the substrate cooling apparatus 10b in height adjustment step S30 of FIG. 7. Referring to FIG. 8, in height adjustment step S30, the controller 2700 controls the elastic unit 2500 to adjust the height of the first region 2301, based on the temperature of the region of the chuck 1000 corresponding to the first region 2301 and the temperature of the region of the chuck 1000 corresponding to the second region 2302 that are measured in first temperature measurement step S20. According to an embodiment, in height adjustment step S30, the controller 2700 raises the first region 2301 to a higher position with an increase in the temperature difference between the region of the chuck 1000 corresponding to the first region 2301 and the region of the chuck 1000 corresponding to the second region 2302. According to an embodiment, in height adjustment step S30, the controller 2700 controls the air regulation member 2520 to regulate the amount of air received in the air spring 2510, thereby adjusting the height of the first region 2301. The adjusted height of the first region 2301 depending on the temperature difference between the region of the chuck 1000 corresponding to the first region 2301 and the region of the chuck 1000 corresponding to the second region 2302 may be set through a test operation.

Figure 9:
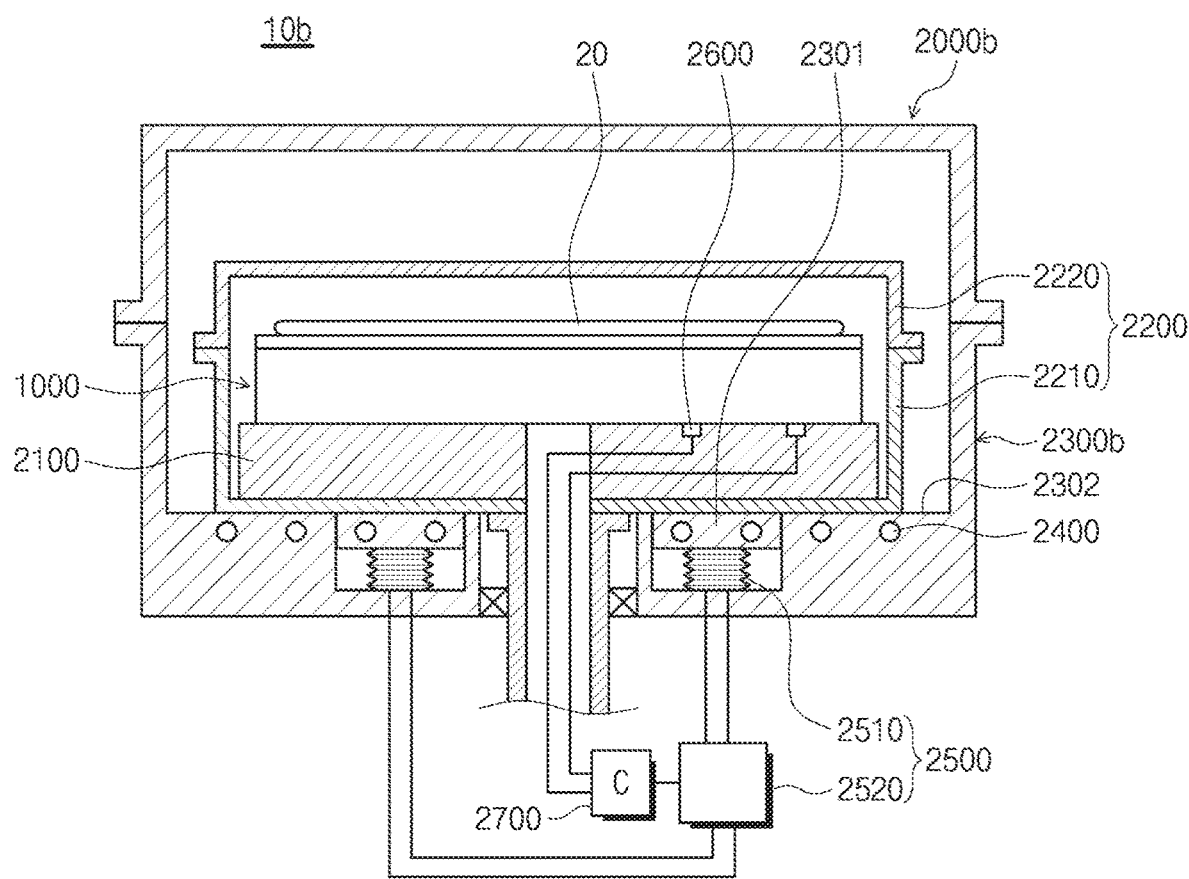
FIG. 9 is a side sectional view illustrating a state of the substrate cooling apparatus in which a lowering step of FIG. 7 is completed.

FIG. 9 is a side sectional view illustrating a state of the substrate cooling apparatus 10b in which lowering step S40 of FIG. 7 is completed. Referring to FIG. 9, in lowering step S40, the inner cover 2200 is lowered until the bottom wall of the inner cover 2200 is brought into contact with the first region 2301 and the second region 2302. Because the height of the first region 2301 adjusted in height adjustment step S30 is greater than the height of the second region 2302, the first region 2301 is brought into contact with the bottom wall of the inner cover 2200 for a longer period of time than the second region 2302. Thus, the first region 2301 having a higher temperature than the second region 2302 may be more rapidly cooled than the second region 2302.

In second temperature measurement step S50, the temperature measurement unit 2600 measures the temperatures of respective regions of the chuck 1000 in the state in which the bottom wall of the inner cover 2200 is brought into contact with the first region 2301 and the second region 2302. In second temperature measurement step S50, the temperature measurement unit 2600 measures the temperature of the region of the chuck 1000 corresponding to the first region 2301 and the temperature of the region of the chuck 1000 corresponding to the second region 2302 and transfers the measured temperatures to the controller 2700. The substrate 20 is cooled as the temperature of the chuck 1000 is lowered by heat transfer of the cooling member 2400 and the heat dissipation plate 2100.

In height maintaining step S60, the controller 2700 controls the elastic unit 2500 to locate the first region 2301 at the same height as the second region 2302 in the state in which the bottom wall of the inner cover 2200 is spaced apart from the bottom wall of the outer cover 2300b. According to an embodiment, when the inner cover 2200 is moved upward in raising step S70, the controller 2700 adjusts the height of the air spring 2510 by controlling the air regulation member 2520 to locate the first region 2301 at the same height as the second region 2302. Accordingly, in the case where the inner cover 2200 is moved upward in raising step S70 when the first region 2301 and the second regions 2302 are cooled to the same temperature, the lower surface of the bottom wall of the inner cover 2200 is simultaneously separated from the first region 2301 and the second region 2302, and therefore the inner cover 2200 is brought into contact with the first region 2301 for a longer or shorter period of time than with the second region 2302. As a result, the temperature difference between the region of the chuck 100 corresponding to the first region 2301 and the region of the chuck 1000 corresponding to the second region 2302 may be prevented when the inner cover 2200 is raised.

Figure 10:
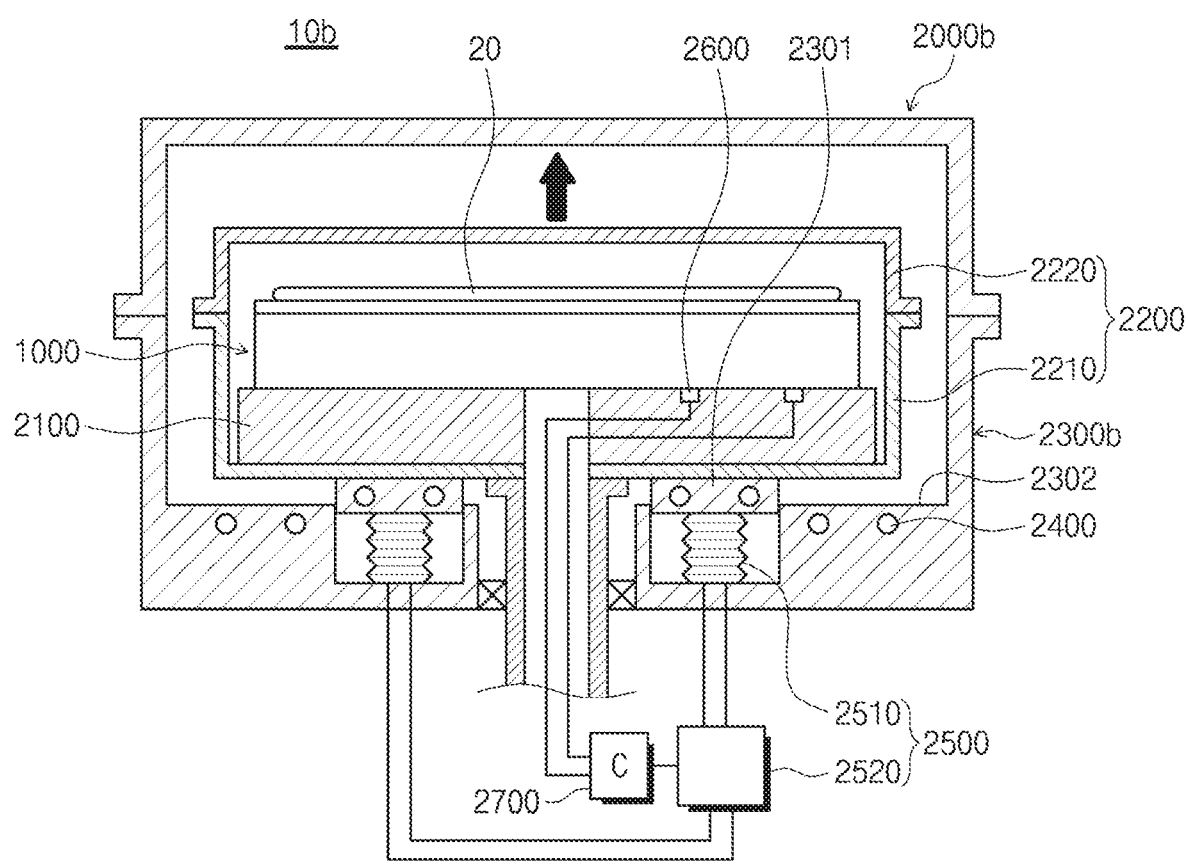
FIG. 10 is a side sectional view illustrating a state of the substrate cooling apparatus in a raising step of FIG. 7.

FIG. 10 is a side sectional view illustrating a state of the substrate cooling apparatus 10b in raising step S70 of FIG. 7. Referring to FIG. 10, in raising step S70, the inner cover 2200 is raised when the temperature of the region of the chuck 1000 corresponding to the first region 2301 and the temperature of the region of the chuck 1000 corresponding to the second region 2302, which are measured in second temperature measurement step S50, are lowered to a predetermined temperature.

In substrate unloading step S80, the substrate 20 is unloaded from the substrate cooling apparatus 10b for a process in the next step.

Hereinafter, outcomes of measuring temperature changes of the chucks of a general substrate cooling apparatus and the substrate cooling apparatuses according to the embodiments of the inventive concept in the state in which high-temperature substrates are mounted on the chucks will be described.

In all three cases, the chucks used to measure the temperatures have a thickness of 38.1 mm and a diameter of 330.2 mm and are formed of an aluminum material (e.g., AL6061-T6). Furthermore, the substrates are glass wafers having the same size. In all the three cases, the temperatures of central portions of the chucks are measured with respect to the thicknesses and upper surfaces of the chucks. In each graph, the x-axis denotes measured time (hour: minute: second), and the y-axis denotes measured temperature (° C.).

Figure 11:
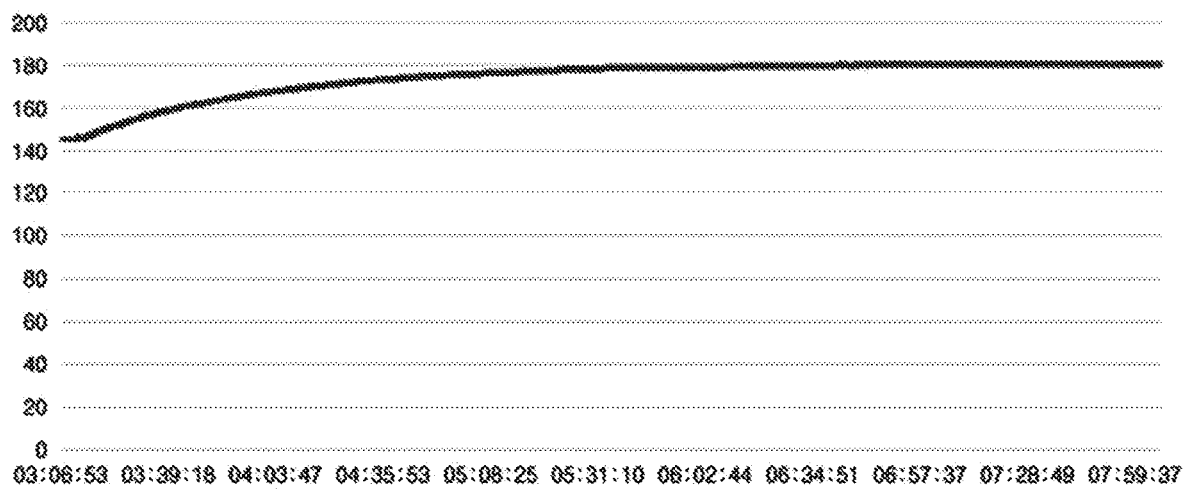
FIG. 11 is a graph depicting a temperature change of a chuck of a general substrate cooling apparatus after a high-temperature substrate is mounted on the chuck.

FIG. 11 is a graph depicting a temperature change of a chuck of a general substrate cooling apparatus after a high-temperature substrate is mounted on the chuck. The general substrate cooling apparatus does not include the heat dissipation plate 2100 illustrated in FIG. 2 and the cooling member 2400 illustrated in FIG. 3. Referring to FIG. 11, it can be seen that a temperature rise of up to about 35° C. occurs after the substrate at 255° C. is mounted on the chuck at 145° C.

Figure 12:
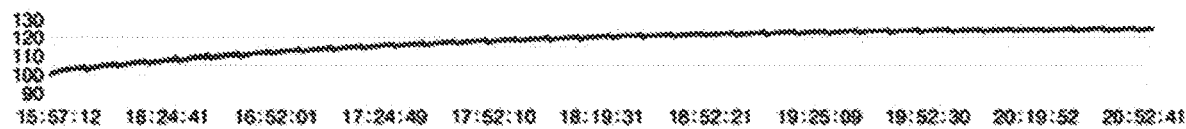
FIG. 12 is a graph depicting a temperature change of a chuck of the substrate cooling apparatus of FIG. 1 after a high-temperature substrate is mounted on the chuck.

FIG. 12 is a graph depicting a temperature change of the chuck 1000 of the substrate cooling apparatus 10 of FIG. 1 after the high-temperature substrate 20 is mounted on the chuck 1000. The heat dissipation plate 2100 has a thickness of 28.7 mm and a diameter of 390 mm and is formed of an aluminum material (e.g., AL6061). The radial grooves 2101, as illustrated in FIG. 2, are provided on the upper surface of the heat dissipation plate 2100. Referring to FIG. 12, it can be seen that a temperature rise of up to about 25° C. occurs after the substrate 20 at 305° C. is mounted on the chuck 1000 at 100° C. Furthermore, it can be seen that the temperature rise is smaller than the temperature rise in FIG. 11 even though the difference between the initial temperature of the chuck 1000 and the initial temperature of the substrate 20 is greater than the temperature difference in FIG. 11.

Figure 13:
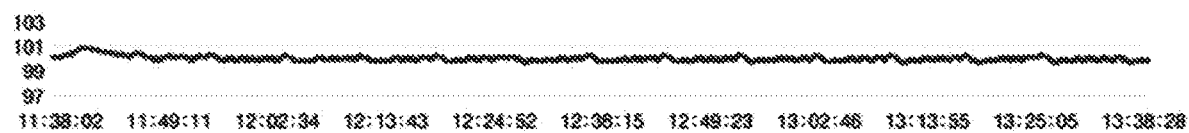
FIG. 13 is a graph depicting a temperature change of a chuck of the substrate cooling apparatus of FIG. 3 after a high-temperature substrate is mounted on the chuck.

FIG. 13 is a graph depicting a temperature change of the chuck 1000 of the substrate cooling apparatus 10a of FIG. 3 after the high-temperature substrate 20 is mounted on the chuck 1000. The heat dissipation plate 2100 has the same structure as the heat dissipation plate 2100 in FIG. 12. As illustrated in FIG. 3, the cooling fluid channel 2400 through which a cooling fluid flows is provided in the bottom wall of the outer cover 2300a. The cooling fluid at room temperature consistently flows in, circulates through, and flows out of the cooling fluid channel 2400. Referring to FIG. 13, it can be seen that the temperature of the chuck 1000 does not rise almost at all after the substrate 20 at 305° C. is mounted on the chuck 1000 at 100° C.

As described above, the substrate cooling apparatuses 10, 10a, and 10b and the substrate cooling method according to the embodiments of the inventive concept provide the heat dissipation plate 2100 and/or the cooling member 2400, thereby preventing the temperature of the chuck from being excessively raised by the heat of the substrate and improving the cooling efficiency. In addition, the substrate cooling apparatus 10b and the substrate cooling method according to the embodiments of the inventive concept adjust the height of the first region, thereby uniformly cooling the substrate.

The substrate cooling apparatus and method according to the embodiments of the inventive concept may prevent the temperature of the chuck from being excessively raised by the heat of the substrate.

Furthermore, the substrate cooling apparatus and method according to the embodiments of the inventive concept may uniformly cool the substrate.

In addition, the substrate cooling apparatus and method according to the embodiments of the inventive concept may improve the cooling efficiency.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for cooling a substrate, the apparatus comprising:
a chuck on which the substrate is placed; and
a cooling unit configured to cool the chuck,
wherein the cooling unit includes a heat dissipation plate having the chuck placed on an upper surface thereof, the heat dissipation plate being configured to dissipate heat of the chuck,
wherein the cooling unit further includes:
an inner cover having the heat dissipation plate supported on an upper surface of a bottom wall thereof, the inner cover being configured to move in a vertical direction; and
a cooling member provided under the bottom wall of the inner cover and configured to cool the inner cover.

2. The apparatus of claim 1, wherein the heat dissipation plate has, on the upper surface thereof, grooves concavely formed downward.

3. The apparatus of claim 2, wherein the grooves are radially formed when viewed from above.

4. The apparatus of claim 1, wherein the cooling unit further includes an outer cover having a space formed therein in which the inner cover is received, and
wherein the cooling member is provided on a bottom wall of the outer cover.

5. The apparatus of claim 4, wherein the bottom wall of the outer cover includes a first region and a second region that is a different region from the first region, and
wherein the cooling unit further includes:
an elastic unit configured to support the first region and apply elastic force to the first region in the vertical direction to locate the first region in a higher position than the second region in a state in which the bottom wall of the inner cover is spaced apart from the bottom wall of the outer cover;
a temperature measurement unit configured to measure temperatures of respective regions of the chuck; and
a controller configured to control the elastic unit to adjust a height of the first region in the state in which the bottom wall of the inner cover is spaced apart from the bottom wall of the outer cover, based on temperature of a region of the chuck corresponding to the first region and temperature of a region of the chuck corresponding to the second region that are measured by the temperature measurement unit.

6. The apparatus of claim 5, wherein the elastic unit includes:
an air spring configured to support the first region; and
an air regulation member configured to supply air into the air spring and release the air from the air spring, and
wherein the controller controls the air regulation member to regulate an amount of air received in the air spring and thus control the height of the first region.

7. A method for cooling a substrate using the apparatus of claim 5, the method comprising:
a substrate mounting step of mounting the substrate on the chuck in a state in which the inner cover is raised so as to be spaced apart from the bottom wall of the outer cover;
a first temperature measurement step of measuring temperatures of respective regions of the chuck;
a height adjustment step of adjusting the height of the first region, based on temperature of a region of the chuck corresponding to the first region and temperature of a region of the chuck corresponding to the second region that are measured in the temperature measurement step;

a lowering step of lowering the inner cover until the bottom wall of the inner cover is brought into contact with the first region and the second region;

a second temperature measurement step of measuring temperatures of respective regions of the chuck in a state in which the bottom wall of the inner cover is brought into contact with the first region and the second region; and a raising step of raising the inner cover when temperature of the region of the chuck corresponding to the first region and temperature of the region of the chuck corresponding to the second region that are measured in the second temperature measurement step are lowered to a predetermined temperature.

8. The method of claim 7, wherein the elastic unit includes:

an air spring configured to support the first region; and an air regulation member configured to supply air into the air spring and release the air from the air spring, and wherein in the height adjustment step, the height of the first region is adjusted by regulating an amount of air received in the air spring by using the air regulation member.

9. The method of claim 7, wherein in the height adjustment step, the first region is raised to a higher position with an increase in a temperature difference between the region of the chuck corresponding to the first region and the region of the chuck corresponding to the second region.

10. The method of claim 9, further comprising:

a height maintaining step between the second temperature measurement step and the raising step, wherein in the height maintaining step, the elastic unit is controlled to locate the first region at the same height as the second region in a state in which the bottom wall of the inner cover is spaced apart from the bottom wall of the outer cover.

\* \* \* \* \*